United States Patent [19]

Canning, deceased et al.

[11] 4,381,489
[45] Apr. 26, 1983

[54] PASS FILTER CIRCUIT ARRANGEMENT

[75] Inventors: Jonathan R. Canning, deceased, late of Burgess Hill, England, by Francis R. Canning, administrator; Kenneth W. Moulding, Horley; Gordon A. Wilson, Reigate, both of England

[73] Assignee: U.S. Philips Corporation, New York, N.Y.

[21] Appl. No.: 293,435

[22] Filed: Aug. 17, 1981

Related U.S. Application Data

[63] Continuation of Ser. No. 142,940, Apr. 23, 1980, abandoned.

[30] Foreign Application Priority Data

May 9, 1979 [GB] United Kingdom ............... 7916112

[51] Int. Cl.³ .......................................... H03H 11/08
[52] U.S. Cl. .................................. 333/215; 330/107
[58] Field of Search ........................................ 333/215

[56] References Cited

U.S. PATENT DOCUMENTS 3,517,342 6/1970 Orchard et al. ................ 333/215 X

FOREIGN PATENT DOCUMENTS 2229494 1/1974 Fed. Rep. of Germany ...... 333/215

OTHER PUBLICATIONS

Moschytz, *Inductorless Filters: A Survey,* IEEE Spectrum, Sep. 1970, pp. 63, 64 and 65.

*Primary Examiner*—Paul L. Gensler
*Attorney, Agent, or Firm*—Thomas A. Briody; William J. Streeter; Edward W. Goodman

[57] ABSTRACT

In order to facilitate its construction as in integrated circuit, the inductive elements of two resonant circuits in a band-pass filter are each constituted by a first port of a respective gyrator circuit (22, 23 and 24, 25 respectively) the second port of which is loaded by a capacitor (3 and 6 respectively). The first ports, across which are connected capacitors (1 and 3 respectively), are connected by a signal path one to the other, as are the second ports, in such manner that a loop is formed comprising the two gyrator circuits and the two signal paths, enabling bilateral coupling of the two gyrator circuits to be obtained by coupling otherwise unused outputs (24+ and 22+) to otherwise unused inputs (22− and 24− respectively) of two-input two-output voltage-controlled current sources (22, 24) which form part of each gyrator circuit.

3 Claims, 12 Drawing Figures

PASS FILTER CIRCUIT ARRANGEMENT

This is a continuation of application Ser. No. 142,940, filed Apr. 23, 1980, now abandoned.

BACKGROUND OF THE INVENTION

This invention relates to a pass filter arrangement comprising (a) a first resonant circuit comprising a first inductive element and a first capacitance, (b) a second resonant circuit comprising a second inductive element and a second capacitance, and (c) a bilateral coupling between said inductive elements.

Bandpass filters formed from discrete inductors and capacitors normally comprise a pair of series or parallel resonant circuits (which may have the same or different resonant frequencies) coupled together by a reactance such as a capacitor, a discrete inductor or the mutual inductance between the inductors included in the two resonant circuits. In general, if the resonant frequencies of both resonant circuits are the same and it is required that the pass band of the filter is to be wider than that which would be given by a combination of the two resonant circuits acting individually, the coupling has to satisfy the requirements that it is inverting over the total path from each inductor back to that inductor via the other inductor (which requirement is met when the coupling comprises a single capacitor or inductance because a signal passing through the capacitor or inductance and then back again experiences two phase shifts of 90° in the same sense in succession).

There is considerable interest at the present time in the replacement of discrete inductors by active circuits which can be constructed in integrated circuit form. For example, it is known that an inductor can be replaced by the driving point impedance of a capacitively-loaded gyrator circuit, i.e. the driving point impedance of a comparatively loaded two-port for which the admittance matrix is ideally $$\begin{vmatrix} 0 & -g \\ +g & 0 \end{vmatrix}.$$

If the inductors in the resonant circuits of the aforementioned bandpass filters are replaced by such active circuits it is still necessary to provide the coupling between the inductors, and if the resonant frequencies of both resonant circuits are the same and it is required that the passband of the filter is to be wider than that which would be given by a combination of the two resonant circuits acting individually, this prima facie requires the provision of a further inductor (which may be simulated) or a further capacitor.

An article entitled "Feedback IF amplifiers for television" by H. S. Jewitt in "Wireless World," December 1954, page 609 et seq. in particular FIG. 2 on page 609, discloses a bandpass filter circuit which comprises a pair of parallel resonant circuits (formed using discrete inductors) with a non-reciprocal bilateral coupling between them, which coupling does not include elements having substantial reactance at the resonant frequency of either of the two resonant circuits. More specifically, in this known filter circuit the coupling comprises an inverting amplifier coupling one resonant circuit to the other resonant circuit, and a resistive coupling from said other resonant circuit back to said one resonant circuit. Thus the coupling is inverting over the total path from each inductor back to that inductor via the other inductor, as required. It will be obvious that making the coupling non-reactive in this or a similar way can itself be attractive when attempting to construct a bandpass filter in integrated circuit form, as such a coupling, at least in principle, does not require any capacitors or inductors.

It is known that a gyrator can be formed by interconnecting a pair of voltage-controlled current sources, one of which is inverting from input to output and the other of which is non-inverting from input to output, in such manner that the input of each source is connected to the output of the other source, each resulting commoned input of one source and output of the other source constituting one port of the gyrator. The coupling between the two resonant circuits in the filter disclosed in the aforesaid article in "Wireless World," as mentioned previously, is formed by an inverting signal path from one inductor to the other inductor, and a non-inverting signal path from said other inductor to said one inductor, and it will be appreciated that a gyrator constructed from a pair of voltage-controlled current sources in the manner outlined above also has this property. If, therefore, the coupling in the filter disclosed in the "Wireless World" article is replaced by a gyrator, and if each inductor therein is replaced by the driving point impedance of a corresponding capacitively-loaded gyrator, a bandpass filter will still be obtained. This filter will be as shown in FIG. 1 of the accompanying diagrammatic drawings, in which one parallel resonant circuit is constituted by a capacitor 1 in parallel with an inductive element comprising the driving point impedance of a gyrator 2 loaded by a capacitor 3, the other parallel resonant circuit is constituted by a capacitor 4 in parallel with an inductive element comprising the driving point impedance of a gyrator 5 loaded by a capacitor 6, and the coupling between the two inductive elements is constituted by a gyrator 7. Such a construction for a bandpass filter is attractive when it is desired to construct the filter in integrated circuit form as, at least in principle, only four capacitors and no inductors are required.

However, it is desirable that a circuit constructed in integrated circuit form should contain as few circuit elements as possible (in order to minimize the chip area required) and that the circuit should be designed so that its overall properties are as little sensitive as possible to production spreads occurring in the manufacture of the circuit. One way to achieve the latter property is to construct any amplifier which may be present in a balanced manner, for example so that it comprises a long-tailed pair of transistors. In general such an amplifier will have two inputs and two outputs and will be non-inverting and inverting, respectively, from one of said inputs to the first and the second of said outputs, respectively, and will be inverting and non-inverting, respectively, from the other of said inputs to said first and second outputs respectively. As mentioned previously a gyrator may be constructed from a pair of voltage-controlled current sources, one of which is inverting and one of which is non-inverting, the output of each being connected to the input of the other. If each gyrator of FIG. 1 is constructed in this manner, and if each voltage-controlled current source is constructed in a balanced manner, the arrangement of FIG. 2 of the accompanying diagrammatic drawings can be obtained, where the gyrator 2 of FIG. 1 has been replaced by a pair of voltage-controlled current sources 8 and 9, the gyrator 5 of FIG. 1 has been replaced by a pair of voltage-controlled current sources 10 and 11, and the gyrator 7 of FIG. 2 has been replaced by a pair of voltage-controlled current sources 12 and 13.

An undesirable feature of the circuit of FIG. 2 is that each capacitor 1 and 5 has inputs of two of the sources 8–13 connected to it and also outputs of two of the sources 8–13 connected to it, which feature tends to make the overall performance of the circuit unpredictable and somewhat susceptible to production spreads when it is manufactured in integrated circuit form, particularly in view of the fact that each capacitor 3 and 6 has only one such input and only one such output connected to it. In order to overcome this problem, it would be desirable if the couplings between the capacitors 1 and 5, formed by the sources 12 and 13, could be replaced by signal paths from capacitor 1 to capacitor 5 via sources 8 and 11, and from capacitor 5 to capacitor 1 via sources 10 and 9, respectively, in particular by coupling the "unused" output of source 8 to the "unused", i.e. grounded input of source 11 and by coupling the "unused" output of source 10 to the "unused" i.e. grounded input of source 9. Such a measure would also result in considerable simplification of the arrangement. However, it will be seen that taking these steps will result in a non-inverting signal path from capacitor 1 to capacitor 5 and in a non-inverting signal path from capacitor 5 to capacitor 1, rather than in signal paths the other of which is non-inverting and one of which is inverting as required. It is of course possible to modify the circuit of FIG. 2 by making the source 8 inverting and the source 9 non-inverting and/or by making the source 10 non-inverting and the source 11 inverting but consideration of the various possibilities given by these modifications reveals that attempting to replace the sources 12 and 13 by pairs of the sources 8–11 together with couplings between "unused" inputs and outputs thereof will still always result in couplings between the capacitors 1 and 3 which are either inverting in both directions or non-inverting in both directions.

SUMMARY OF THE INVENTION

It is an object of the invention to provide alternative forms of filter circuit arrangement some of which allow this disadvantage to be mitigated.

The invention provides a pass filter circuit arrangement comprising (a) a first resonant circuit comprising a first inductive element and a first capacitance, (b) a second resonant circuit comprising a second inductive element and a second capacitance, and (c) a bilateral coupling between said inductive elements, characterised in that said first inductive element is constituted by the impedance presented by a first port of a first gyrator circuit which has a third capacitance in parallel with its second port, in that said second inductive element is constituted by the impedance presented by a first port of a second gyrator circuit which has a fourth capacitance in parallel with its second port, and in that said coupling is created by the provision of a first substantially unilateral signal path from one port to the first gyrator circuit to one port of the second gyrator circuit and a second substantially unilateral signal path from the other port of the second gyrator circuit to the other port of the first gyrator circuit, said first signal path bypassing each said other port and said second signal path bypassing each said one port so that a loop is formed by said gyrator circuits and said first and second signal paths, each said signal path being devoid of elements having substantial reactance at the resonant frequency of either said resonant circuit.

It has now been recognised that the loop formed by the direct couplings from capacitor 1 to capacitor 4 and from capacitor 4 to capacitor 1 of FIG. 1 implied by gyrator 7 can be replaced by a loop which includes a signal path through each gyrator. Thus, for example, the coupling from capacitor 1 to capacitor 4 may be replaced by a coupling from capacitor 3 to capacitor 6. As another example, the coupling from capacitor 4 to capacitor 1 may be replaced by a coupling from capacitor 6 to capacitor 3. If each gyrator comprises a pair of interconnected voltage-controlled current sources one of which is inverting and one of which is non-inverting, as set out hereinbefore (of course other forms of gyrator are alternatively possible, for example a pair of similarly interconnected current-controlled voltage sources one of which is inverting and the other of which is non-inverting), and if certain of said sources in fact have both an inverting and a non-inverting input and both an inverting and a non-inverting output similar to those shown in FIG. 2, certain of the arrangements obtained by modifying the circuit of FIG. 1 in such a manner allow the two couplings required between the two gyrators to be obtained by interconnecting otherwise unused inputs and outputs of the voltage-controlled current sources from which the gyrators are constructed, as was indicated would be desirable with the arrangement of FIG. 2 but which is in fact impossible with that arrangement.

If the resonant frequencies of both resonant circuits are the same and it is required that the pass band of the filter arrangement is to be wider than that which would be given by a combination of the two resonant circuits acting individually then, if said gyrator circuits are included in said loop in such manner that one is inverting for signals traversing said loop and the other is inverting for said signals, one of said first and second signal paths should be inverting and the other should be non-inverting, or, if both said gyrator circuits are included in said loop in such manner that both are either non-inverting or inverting for signals traversing said loop, said first and second signal paths should either be both inverting or both non-inverting.

If each of the gyrator circuits comprises a pair of voltage-controlled current sources one of which is inverting and one of which is non-inverting, the input of one of said sources of each pair being connected to the output of the other of said sources of that pair and the input of said other source of each pair being connected to the output of said one source of that pair, and if each of said first and second signal paths is non-inverting, providing certain of the voltage-controlled current sources with both a non-inverting and an inverting input and with both a non-inverting and an inverting output can allow each of said first and second signal paths to be obtained by coupling an otherwise unused output of one of said sources of one pair to an otherwise unused input of one of said sources of the other pair.

A first way of realising this possibility is to provide each of the inverting voltage-controlled current sources with a second input and a second output so that each said inverting voltage-controlled current source is non-inverting to its second output from that input thereof which is connected to the output of the other source of the corresponding pair and is non-inverting from its second input to the output thereof which is connected to the input of the other source of the corresponding pair, and to arrange that said first signal path includes a coupling from the said second output of one said inverting voltage-controlled current source to the said second input of the other said inverting voltage-controlled current source, and that said second signal path includes a coupling from said second output of said other inverting voltage-controlled current source to said second input of said one said inverting voltage-controlled current source. If this is done a non-inverting voltage-controlled current source may be provided with a second input in such manner that it is inverting from its second input to its output, and an input signal path may then be connected to this second input, thereby using said non-inverting voltage-controlled current source also as an input buffer. Moreover the other of said non-inverting voltage-controlled current sources may be provided with a second output in such manner that it is inverting from its input to its second output, and an output signal path may then be connected to this second output, thereby using said other non-inverting voltage-controlled current source as an output buffer. Such an arrangement can be very economical as far as the number of circuit elements required is concerned.

A second way of realising the aforementioned possibility is to provide each of the non-inverting voltage-controlled current sources with a second input and a second output so that each said non-inverting voltage-controlled current source is inverting to its second output from that input thereof which is connected to the output of the other source of the corresponding pair and is inverting from its second input to the output thereof, which is connected to the input of the other source of the corresponding pair, and to arrange that said first signal path includes a coupling from the said second output of one said non-inverting voltage-controlled current source to the said second input of the other said non-inverting voltage-controlled current source, and that said second signal path includes a coupling from said second output of said other non-inverting voltage-controlled current source to said second input of said one of said non-inverting voltage-controlled current sources. If this is done, an inverting voltage-controlled current source may be provided with a second input in such manner that it is non-inverting from its second input to its output, and an input signal path may then be connected to this second input thereby using said inverting voltage-controlled current source also as an input buffer. Moreover, the other of said inverting voltage-controlled current sources may be provided with a second output in such manner that it is non-inverting from its input to its second output, and an output signal path may then be connected to this second output, thereby using said other inverting voltage-controlled current source as an output buffer and again realising an arrangement which can be very economical as far as the number of circuit elements required is concerned.

DESCRIPTION OF THE DRAWINGS

Embodiments of the invention will now be described, by way of example, with reference to the accompanying diagrammatic drawings in which.

DESCRIPTION OF THE PREFERRED EMBODIMENT

Figure 1:
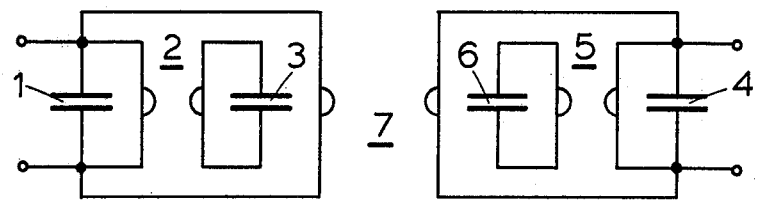
FIG. 1 shows the arrangement obtained when the inductors in the circuit disclosed in the aforementioned "Wireless World" articles are replaced by capacitor-loaded gyrators, and the couplings between said gyrators are replaced by a further gyrator, as previously discussed.
Figure 3A:
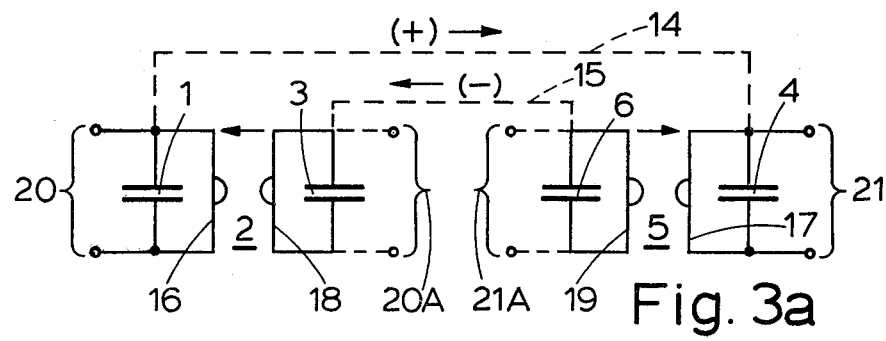
FIGS. 3a-3g are diagrams showing the basic configurations of seven embodiments of the invention.
Figure 3B:
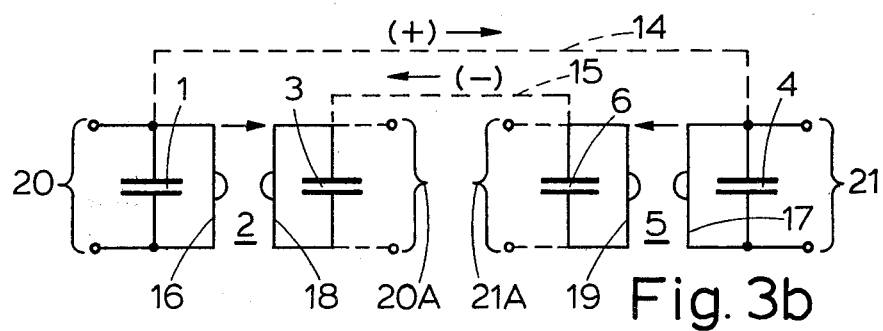
Figure 3C:
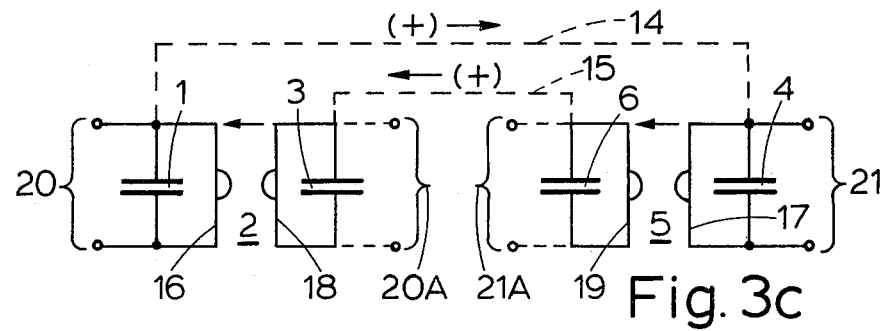
Figure 2:
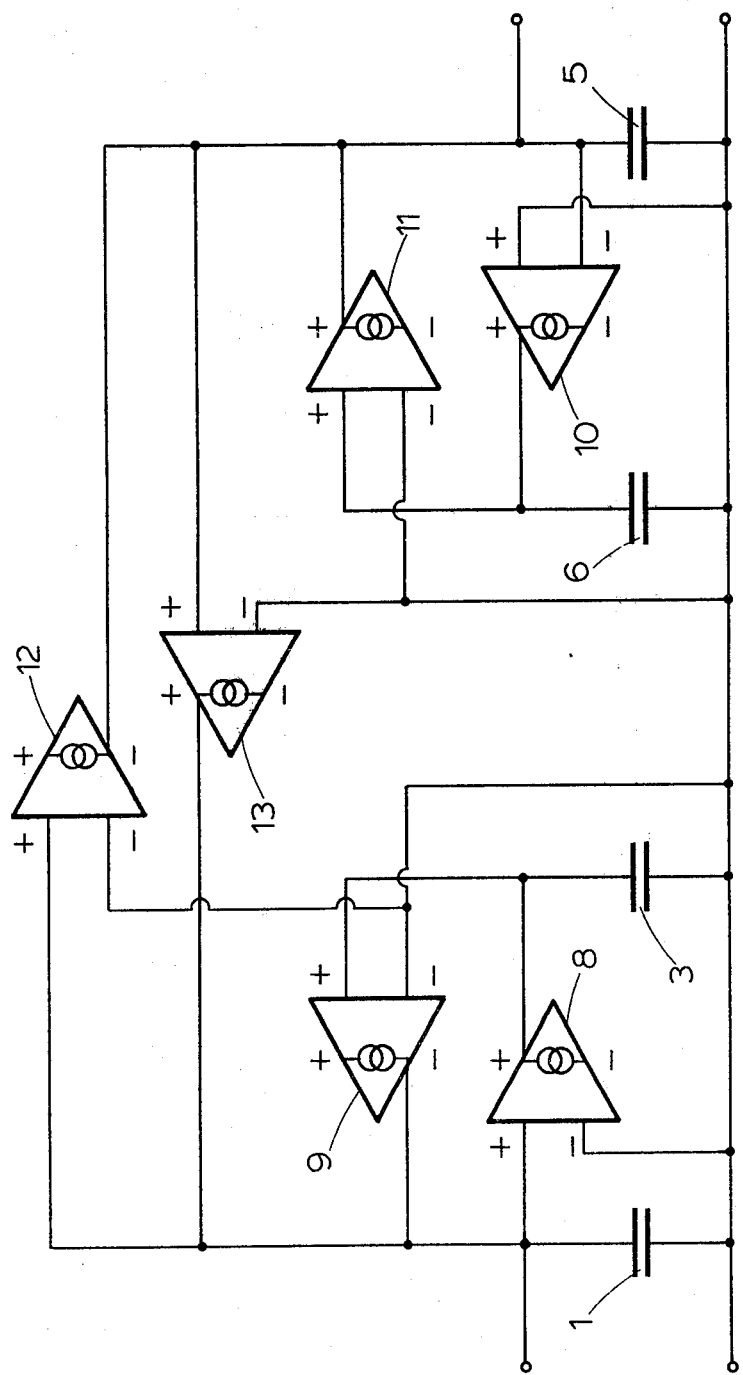
FIG. 2 shows the arrangement of FIG. 1 with the various gyrators constructed in a specific manner, as previously discussed.
Figure 3D:
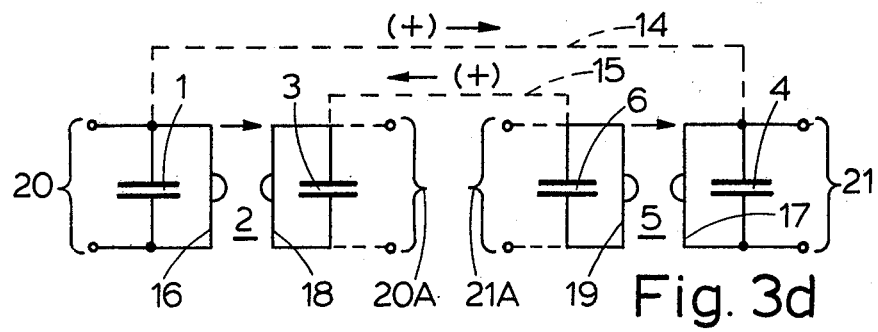
Figure 3E:
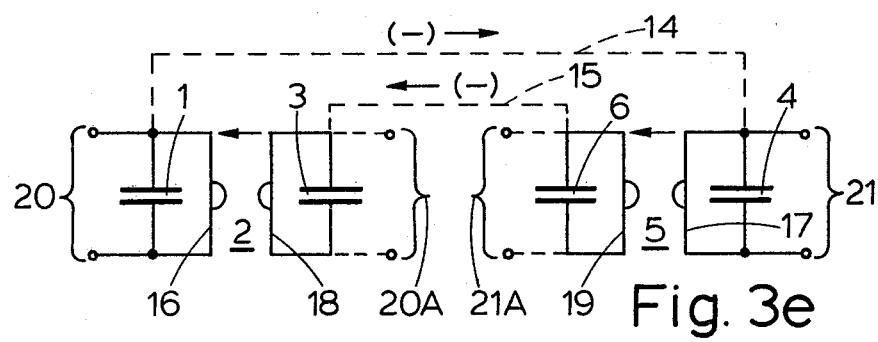
Figure 3F:
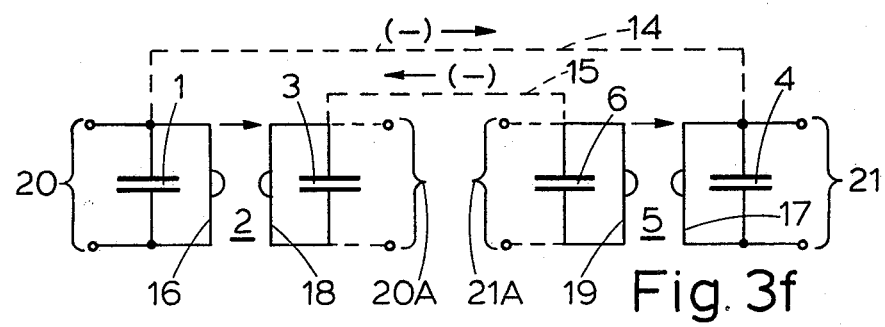
Figure 3G:
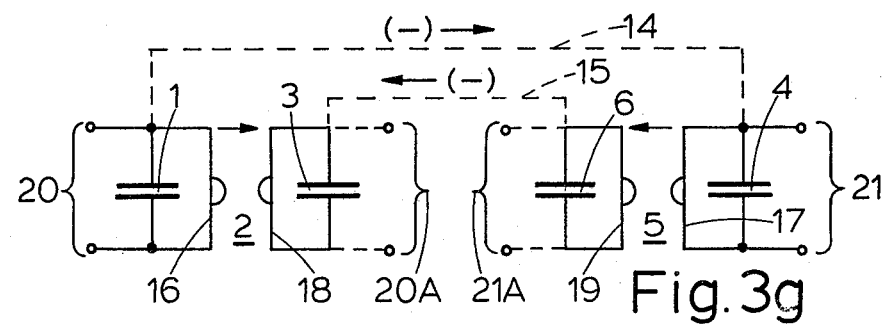

FIGS. 3a-3f each show the configuration of a different bandpass filter, and FIG. 3g shows the configuration of a further pass filter. Each filter includes a first resonant circuit comprising a first inductive element 2, 3 and a first capacitance 1, and a second resonant circuit comprising a second inductive element 5, 6 and a second capacitance 4. Each inductive element is constituted by the impedance presented by a first port (16 and 17 respectively) of a gyrator circuit (2 and 5 respectively) the second port of which (18 and 19 respectively) has a further capacitance (3 and 6 respectively) connected in parallel therewith. An input signal path 20 is connected to the parallel combination of each capacitance 1 and the first port 16 of the corresponding gyrator circuit 2, and an output signal path 21 is connected to the parallel combination of each capacitance 4 and the first port 17 of the corresponding gyrator circuit 5. Each gyrator circuit 2 and 5 in fact comprises a pair of voltage-controlled current sources (not shown) the input of each source of each pair being connected to the output of the other source of the corresponding pair. Thus a voltage-controlled current source couples each port 16 or 17 to the corresponding port 18 or 19 and another voltage-controlled current source couples each port 18 or 19 to the corresponding port 16 or 17. One source of each pair is non-inverting and the other is inverting; the arrow shown adjacent each gyrator 2, 5 denotes the direction of the non-inverting coupling. Thus, for example, in FIG. 3a the inverting source of the gyrator 2 has its input connected to the port 16 and its output connected to the port 18 and the inverting source of the gyrator 5 has its input connected to the port 17 and its output connected to the port 19.

Each filter circuit also includes a first signal path 14 from the port 16 of the corresponding gyrator 2 to the port 17 of the corresponding gyrator 5, and a second signal path 15 from the port 19 of the corresponding gyrator 5 to the port 18 of the corresponding gyrator 2, each of the paths 14 and 15 being devoid of elements which have substantial reactance at the resonant frequency of either resonant circuit. Path 14 bypasses the ports 18 and 19 and path 15 bypasses the ports 16 and 17. Whether the various paths (shown as dashed lines) are non-inverting or inverting is signified by "(+)" or "(−)", respectively, adjacent the corresponding path. Thus, for example, in FIG. 3a the path 14 is non-inverting and the path 15 is inverting. These paths 14 and 15, together with signal paths through the gyrators 2 and 5, where appropriate, constitute a bilateral coupling between the pair of ports 16 and 17, this coupling comprising one signal path (path 14) from the port 16 to the port 17 and another signal path (path 15 plus the path within gyrator 5 from port 17 to port 19 plus the path within gyrator 2 from port 18 to port 16) from the port 17 to the port 16. Thus, for example, in FIG. 3a the one signal path is constituted by the non-inverting path 14, and the other signal path is constituted by the inverting voltage-controlled current source in gyrator 5, the inverting path 15, and the non-inverting voltage-controlled current source in gyrator 2. It will be seen that, in each of FIGS. 3a to 3g, the loop, including the first and second signal paths, includes two of the signal paths in the gyrators 2 and 5 between the two ports thereof. In FIGS. 3a and 3b the gyrators 2 and 5 are included in the loop formed by these gyrators 2, 5 and the paths 14 and 15 in such manner that one of these gyrators 2, 5 is inverting for signals traversing this loop and the other is non-inverting for these signals, and one of the paths 14 and 15 is inverting and the other is non-inverting, whereas in FIGS. 3c–3f the gyrators 2 and 5 are included in the loop formed by these gyrators 2, 5 and the paths 14 and 15, in such manner that both of these gyrators 2, 5 are either inverting or non-inverting for signals traversing this loop, and paths 14 and 15 are either both inverting or both non-inverting. This means that, if the resonant circuit 1, 2, 3 and 4, 5, 6 both have the same resonant frequency, in each of these arrangements the pass band of the arrangement will be wider than that which would be given by a combination of the two resonant circuits acting individually. On the other hand, in FIG. 3g the gyrators 2 and 5 are included in the loop formed by these gyrators 2, 5 and the paths 14 and 15 in such manner that one of these gyrators 2, 5 is inverting for signals traversing this loop and the other is non-inverting for these signals, and both of the paths 14 and 15 are inverting. This means that, if the resonant circuits 1, 2, 3 and 4, 5, 6 of the arrangement of FIG. 3g both have the same resonant frequency, the pass band of this arrangement will be narrower than that which would be given by a combination of the two resonant circuits acting individually.

In each of FIGS. 3a to 3g the input and output signal paths may be interchanged if desired. Moreover, in each of these Figures the input/output path 20 may be connected as an alternative to the other port 18 of gyrator 2 (as shown in dashed lines at 20A) and/or the output/input path 21 may be connected as an alternative to the other port 19 of gyrator 5 (as shown in dashed lines at 21A). A suitable choice of one of these alternatives with respect to FIGS. 3a to 3g enables a choice to be made of the form of the response curve of the filter within the pass-band. For example, with the filter of FIG. 3a, choosing the input to be at 20 and the output at 21 gives a slight upward tilt in the passband, whereas choosing the input at 20A and the output at 21A gives a transmission factor approximately proportional to $1/f^2$ within the pass-band, whereas choosing the input at 20 or 20A and the output at 21A or 21, respectively, gives a transmission factor approximately proportional to $1/f$ within the pass-band (as does conventional top inductive coupling), where f is input signal frequency.

It will be appreciated that, instead of applying the input signal across one of the capacitors 1, 3, 4 and 6 of FIGS. 3a–3g and deriving the output signal from across another of said capacitors in one of the ways described, the input signal may be injected in series with the relevant capacitor by means of a low output-resistance source and the output signal may be derived from across a low-value resistance included in series with the other relevant capacitor.

Figure 4:
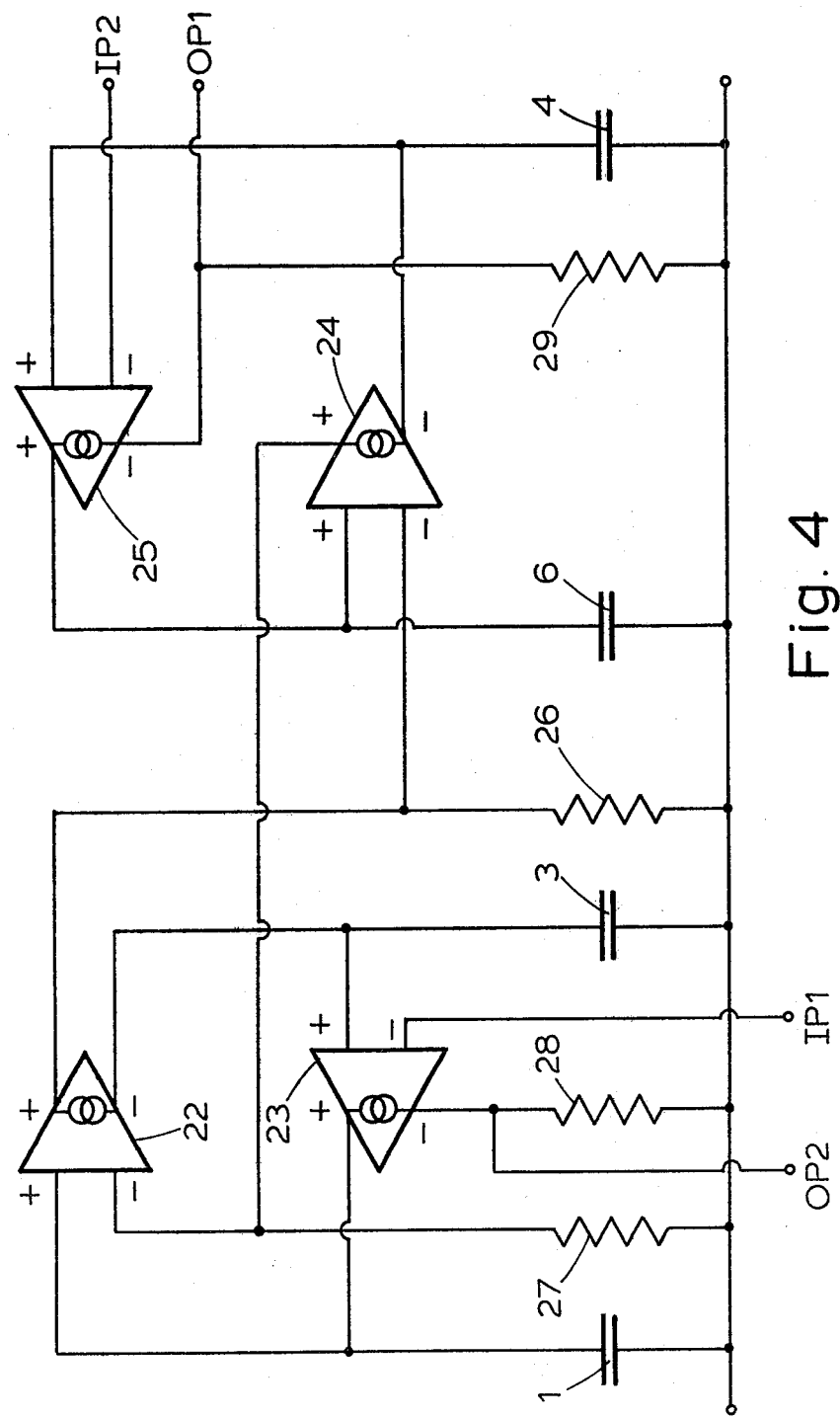
FIG. 4 shows a possible construction for the configuration of FIG. 3c in more detail.

FIG. 4 shows a possible construction for the configuration of FIG. 3c in more detail. As shown in FIG. 4, the gyrator circuit 2 of FIG. 3c comprises a pair of voltage-controlled current sources 22 and 23 with the (+) input of (inverting) source 22 connected to the (+) output of (non-inverting) source 23 and the (+) input of source 23 connected to the (−) output of source 22. Similarly, the gyrator circuit 5 of FIG. 3c comprises a pair of voltage-controlled current sources 24 and 25 with the (+) input of (inverting) source 24 connected to the (+) output of (non-inverting) source 25 and the (+) input of source 25 connected to the (−) output of source 24. Sources 22 and 24 are each also provided with an inverting input (−) and a non-inverting output (+). The path 14 of FIG. 3c is obtained in FIG. 4 by returning the non-inverting output (+) of source 22 to ground via a resistor 26 and applying the voltage set up across this resistor to the inverting input (−) of source 24. Thus a non-inverting signal path exists from capacitor 1 to capacitor 4 via the sources 22 and 24. Similarly the path 15 of FIG. 3c is obtained in FIG. 4 by returning the non-inverting output (+) of source 24 to ground via a resistor 27 and applying the voltage set up across this resistor to the inverting input (−) of source 22. Thus a non-inverting signal path exists from capacitor 6 to capacitor 3 via the sources 24 and 22. Sources 23 and 25 are each also provided with an inverting input (−) and an inverting output (−), the two said outputs being returned to ground via resistors 23 and 29. In operation either an input signal is applied to the inverting input of source 23 (and thus to capacitor 1) via a terminal IP1, and an output signal is derived from the inverting output (−) of source 25 (i.e. from capacitor 4) via a terminal OP1, or an input signal is applied to the inverting input (−) of source 25 (and thus to capacitor 6) via a terminal IP2 and an output signal is derived from the inverting output (−) of source 23 (i.e. from capacitor 3) via a terminal OP2. In either case one of the sources 23 and 25 will be used as an input buffer and the other will be used as an output buffer. The two cases correspond to providing the input signal path at 20 in FIG. 3c and the output path at 21, and to providing the input path at 21A in FIG. 3c and the output path at 20A, respectively. It will be noted that the arrangement is highly symmetrical and also economical in the use of components, which can be an advantage, particularly when it is constructed in integrated circuit form.

Figure 5:
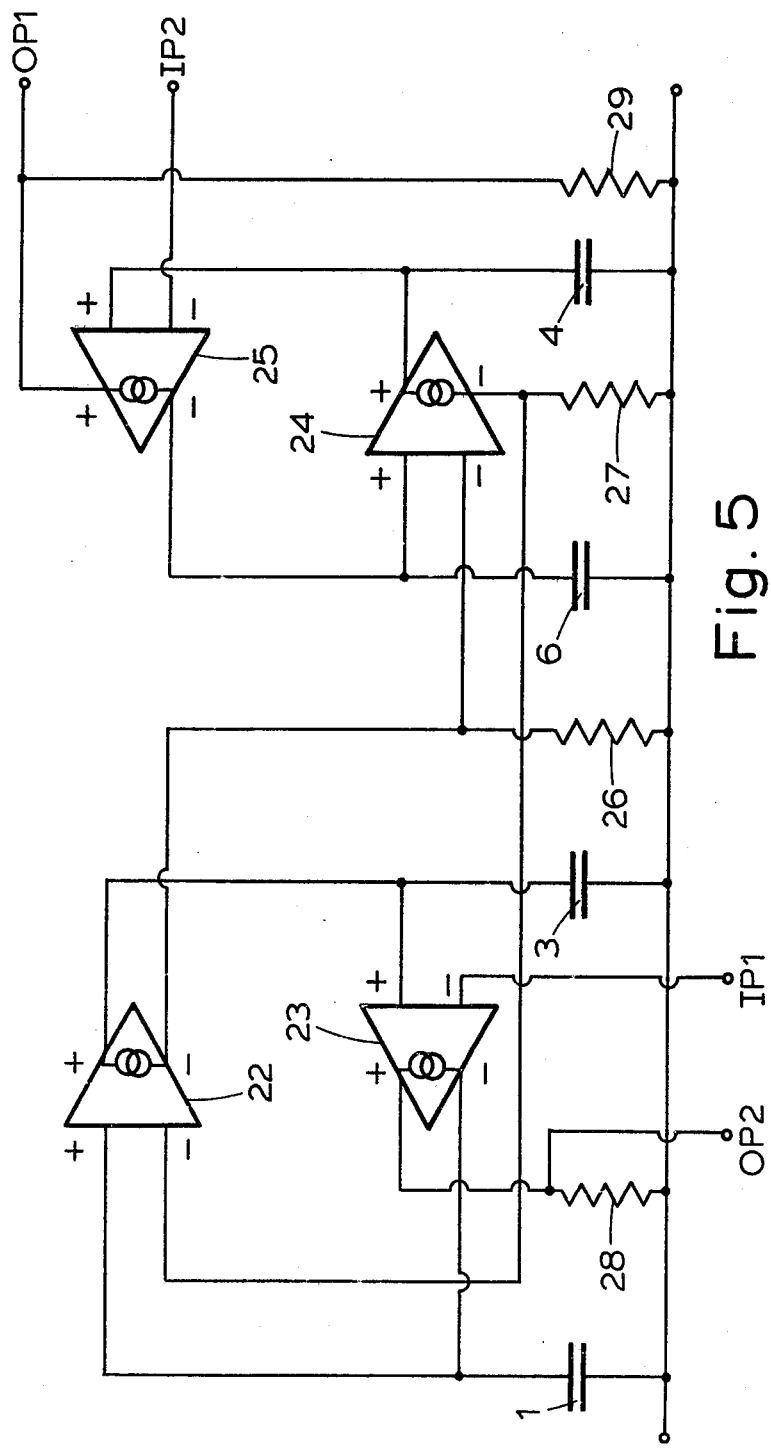
FIG. 5 shows a possible construction for the configuration of FIG. 3d in more detail.

In a similar manner to FIG. 4, FIG. 5 shows a possible construction for the configuration of FIG. 3d in more detail. As shown in FIG. 5, the gyrator circuit 2 of FIG. 3d comprises a pair of voltage-controlled current sources 22 and 23 with the (+) input of (non-inverting) source 22 connected to the (−) output of (inverting) source 23 and the (+) input of source 23 connected to the (+) output of source 22. Similarly, the gyrator circuit 5 of FIG. 3d comprises a pair of voltage-controlled current sources 24 and 25 with the (+) input of (non-inverting) source 24 connected to the (−) output of (inverting) source 25 and the (+) input of source 25 connected to the (+) output of source 24. Sources 22 and 24 are each also provided with an inverting input (−) and an inverting output (−). The path 14 of FIG. 3d is obtained in FIG. 5 by returning the inverting output (−) of source 22 to ground via a resistor 26 and applying the voltage set up across this resistor to the inverting input (−) of source 24. Thus a non-inverting signal path exists from capacitor 1 to capacitor 4 via sources 22 and 24. Similarly the path 15 of FIG. 3d is obtained in FIG. 5 by returning the inverting output (−) of source 24 to ground via a resistor 27 and applying the voltage set up across this resistor to the inverting input (−) of source 22. Thus a non-inverting signal path exists from capacitor 6 to capacitor 3 via the sources 24 and 22. Sources 23 and 25 are each also provided with an inverting input (−) and a non-inverting output (+), the two said outputs being returned to ground via resistors 28 and 29 respectively. In operation either an input signal is applied to the inverting input of source 23 (and thus to capacitor 1) via a terminal IP1, and an output signal is derived from the non-inverting output of source 25 (i.e. from capacitor 4) via a terminal OP1, or an input signal is applied to the inverting input of source 25 (and thus to capacitor 6) via a terminal IP2 and an output signal is derived from the non-inverting output of source 23 (i.e. from capacitor 3) via a terminal OP2. In either case one of the sources 23 and 25 will be used as an input buffer and the other will be made as an output buffer. The two cases correspond to providing the input path at 20 in FIG. 3d and the output path at 21, and to providing the input path at 21A in FIG. 3d and the output path at 20A, respectively. It will be noted that, similarly to FIG. 4, the arrangement of FIG. 5 is highly symmetrical and also economical in the use of components.

The arrangement of FIG. 3g can also be constructed using only four voltage-controlled current sources, in an analogous manner.

As with conventional filters the two resonant circuits which are included in each of the filters of FIG. 3, i.e. the resonant circuit formed by the capacitor 1 and the inductive impedance of the port 16 and the resonant circuit formed by the capacitor 4 and the inductive impedance of the port 17, will normally have resonant frequencies which are at least of the same order, and may be substantially equal to each other. The resonant frequency of each resonant circuit is ideally given by $$w_c = g_o(C_1 C_2)^{-\frac{1}{2}}$$

where $C_1$ and $C_2$ are the values of the capacitors 1, 4 which are connected across the respective ports of the corresponding gyrator 2, 5 and $g_o$ is the magnitude of the transconductance of each voltage-controlled current source which makes up that gyrator (assuming that both sources have transconductances of the same magnitude, which is ideally but not necessarily the case). At high frequencies the above ideal expression for $w_c$ may be modified by the presence of parasitic reactances. If desired, the various filters may be constructed to themselves give rise to gain. This may be done by choosing the gain in the forward path including signal path 14 (which forward path will also include a signal path through gyrator circuit 2 and/or 5 if terminals 20A and/or 21A are used) to be greater than the gain in the reverse path including signal path 15, for example by suitably choosing the relative gains of paths 14 and 15 and/or by suitably choosing the relative gains of the signal paths in each gyrator circuit in the two directions between the ports thereof.

Although each gyrator circuit 2 and 5 of FIG. 3 has been assumed to be formed from a pair of voltage-controlled current sources, one of which is inverting and one of which is non-inverting, connected in inverse parallel, other forms of gyrator may alternatively be used. Thus, for example, the known construction may be used in which each gyrator is constituted by a pair of current-controlled voltage sources, one of which is inverting and one of which is non-inverting, the output of each being connected in series with the input of the other and the resulting two series combinations constituting the respective ports of the resulting gyrator. Normally, however, the voltage-controlled current source realisation will be preferred, as a possible form thereof, more particularly, a so-called "long-tailed pair" of transistors, is particularly convenient for high-frequency operation. Irrespective of the type of gyrator used, the coupling constituted by the paths 14 and 15 may be constructed to transmit voltage or current, i.e. they may be voltage-in/voltage-out paths, current-in/current-out paths, voltage-in/current-out paths, or current-in/voltage-out paths.

Figure 6:
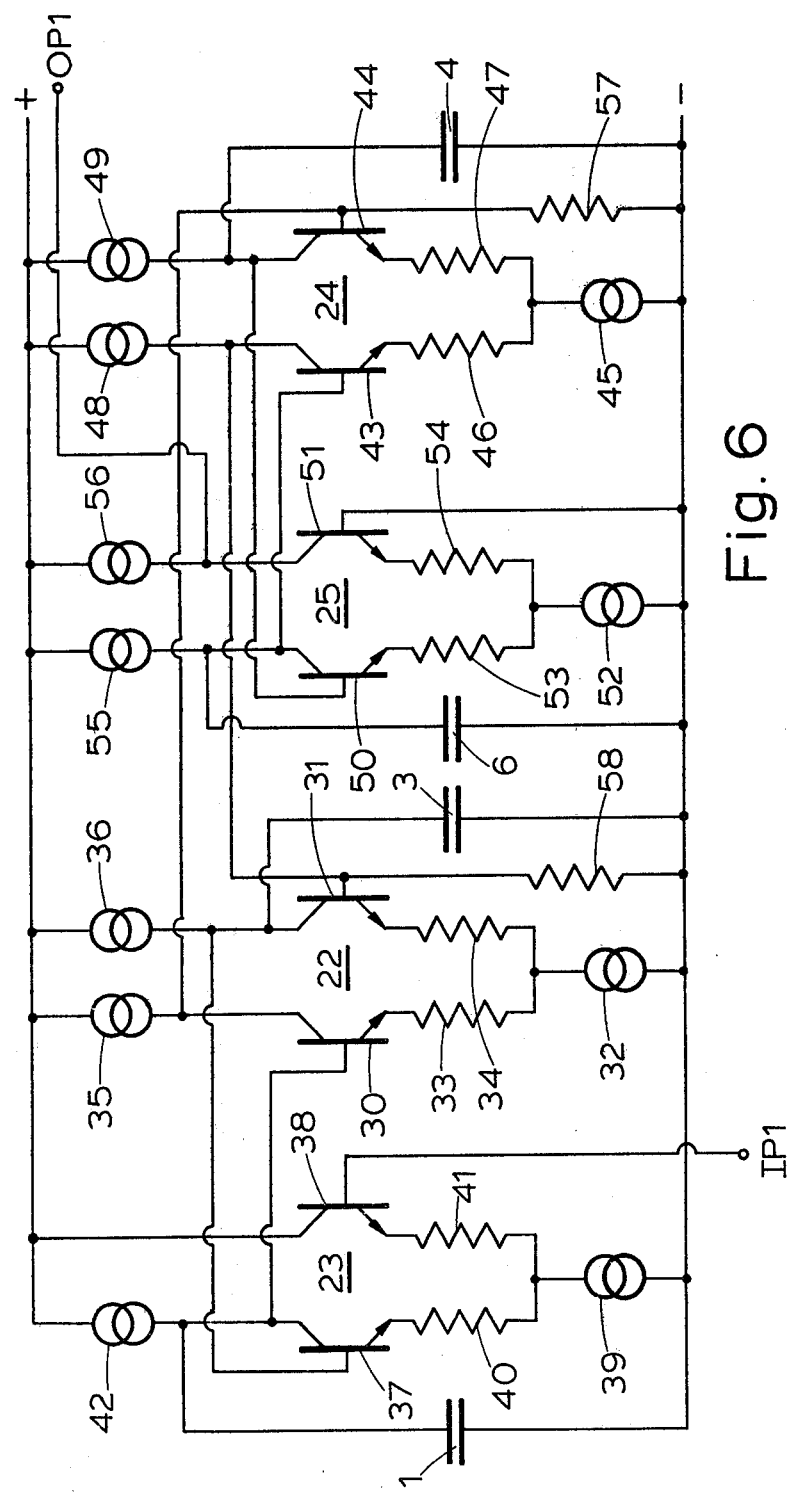
FIG. 6 shows a practical version of the construction of FIG. 5.

FIG. 6 shows a practical construction for the arrangement of FIG. 5 in more detail, the input IP1 and the output OP1 of FIG. 5 having been chosen as the input and output, respectively, of the arrangement of FIG. 6. As shown in FIG. 6, each voltage-controlled current source 22–25 comprises a "long-tailed pair" of transistors, the collector of each transistor being connected to the output of a respective constant-current source, if an output signal is required from that transistor. Thus source 22 comprises a pair of transistors 30 and 31, the emitters of which are connected to the output of a constant current source 32 via resistors 33 and 34, respectively. The collectors of the transistors 30 and 31 are connected to the outputs of constant current sources 35 and 36, respectively. Similarly, source 23 comprises a pair of transistors 37 and 38, the emitters of which are connected to the output of a constant current source 39 via resistors 40 and 41, respectively. The collector of the transistor 37 is connected to the output of a constant current source 42. Similarly, source 24 comprises a pair of transistors 43 and 44, the emitters of which are connected to the output of a constant current source 45 via resistors 46 and 47, respectively. The collectors of the transistors 43 and 44 are connected to the outputs of constant current sources 48 and 49, respectively. Similarly, source 25 comprises a pair of transistors 50 and 51, the emitters of which are connected to the output of a constant current source 52 via resistors 53 and 54, respectively. The collectors of the transistors 50 and 51 are connected to the outputs of constant current sources 55 and 56, respectively.

The collector of transistor 37 is also connected to capacitor 1 and to the base of transistor 30. The collector of transistor 38 is connected directly to the positive supply line. The collector of transistor 30 is also connected to the base of transistor 44 and to ground via a resistor 57. The collector of transistor 31 is also connected to the base of transistor 37 and to capacitor 3. The collector of transistor 50 is also connected to capacitor 6 and to the base of transistor 43. The base of transistor 51 is shown connected to ground for simplicity, although in practice it will be connected in known manner to a source of suitable forward bias potential. The collector of transistor 43 is also connected to the base of transistor 31 and to ground via a resistor 58. The collector of transistor 44 is also connected to capacitor 4 and to the base of transistor 50. The input IP1 is connected to the base of transistor 38 and the output OP1 is connected to the collector of transistor 51.

If desired, the base of each transistor may be fed via an individual emitter follower (not shown) having an emitter load resistor, the value of which is in the order of, for example, 10 kohms. Such emitter followers can provide d.c. level shifts where required because of the d.c.-couplings used. The value of each of the resistors 33, 34, 40, 41, 46, 47, 53, 54 may be, for example in the order of 1 kohm. The values of resistors 57 and 58 are chosen to give the degree of coupling required. The various "constant" current sources may be constituted, for example, by high-value resistors, suitably biassed transistors in common emitter mode (pnp transistors for the sources 35, 36, 48, 49, 55 and 56, and npn transistors for the sources 32, 39, 45 and 53), or depletion mode FETs having their gates connected to their sources (p-channel FETs for the sources 35, 36, 48, 49, 55 and 56, and n-channel FETs for the sources 32, 39, 45 and 52). The bipolar transistors shown in FIG. 6 may of course be replaced by field-effect transistors.

It is claimed:

1. A pass filter circuit arrangement having (a) a first resonant circuit including a first inductive element and a first capacitance, (b) a second resonant circuit including a second inductive element and a second capacitance, and (c) a bilateral coupling between said inductive elements, said first inductive element being constituted by the impedance presented by a first port of a first gyrator circuit which has a third capacitance in parallel with its second port, said second inductive element being constituted by the impedance presented by a first port of a second gyrator circuit which has a fourth capacitance in parallel with its second port, and said bilateral coupling including a first substantially unilateral signal path from one port of the first gyrator circuit to one port of the second gyrator circuit and a second substantially unilateral signal path from the other port of the second gyrator circuit to the other port of the first gyrator circuit, said first signal path bypassing each of said other ports of said gyrator circuits and said second signal path bypassing each of said one ports of said gyrator circuits, whereby a loop is formed by said gyrator circuits and said first and second signal paths, each of said signal paths being devoid of elements having substantial reactance at the resonant frequency of either of said resonant circuits, characterized in that each of the gyrator circuits comprises a first and a second voltage-controlled current source, each of said first current sources having a first and a second input, which constitute a differential pair of inputs, and a first and a second output, which constitute a differential pair of outputs, the first input of each first current source being connected to the output of the second current source of the corresponding gyrator circuit and the input of each second current source being connected to the first output of the first current source of the corresponding gyrator circuit, one of the current sources of each gyrator circuit being inverting from the input thereof, which is connected to an output of the other current source of the corresponding gyrator circuit, to the output thereof, to which an input of the other current source of the corresponding gyrator circuit is connected, and the other of said current sources of each gyrator circuit being non-inverting from the input thereof, which is connected to an output of the one current source of the corresponding gyrator circuit, to the output thereof, to which an input of the one current source of the corresponding gyrator circuit is connected; said first signal path includes a coupling from the second output of the first current source of one gyrator circuit to the second input of the first current source of the other gyrator circuit, and said second signal path includes a coupling from the second output of the first current source of said other gyrator circuit to the second input of the first current source of said one gyrator circuit.

2. An arrangement as claimed in claim 1, characterized in that one of said second current sources is provided with a second input to which an input signal path is connected, the two inputs of this second source constituting a differential pair of inputs, and the other of said second current sources is provided with a second output to which an output signal path is connected, the two outputs of this other second current source constituting a differential pair of outputs.

3. An arrangement as claimed in claim 1 or claim 2, characterized in that said gyrator circuits are included in said loop in such manner that both are either non-inverting or inverting for signals traversing said loop, and said first and second signal paths are both non-inverting.

* * * * *